United States Patent
Marzaki

(10) Patent No.: US 11,637,106 B2
(45) Date of Patent: Apr. 25, 2023

(54) CAPACITIVE ELEMENT COMPRISING A MONOLITHIC CONDUCTIVE REGION HAVING ONE PART COVERING A FRONT SURFACE OF A SUBSTRATE AND AT LEAST ONE PART EXTENDING INTO AN ACTIVE REGION PERPENDICULARLY TO THE FRONT SURFACE

(71) Applicant: STMicroelectronics (Rousset) SAS, Rousset (FR)

(72) Inventor: Abderrezak Marzaki, Aix en Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 31 days.

(21) Appl. No.: 17/493,226

(22) Filed: Oct. 4, 2021

(65) Prior Publication Data
US 2022/0028863 A1    Jan. 27, 2022

Related U.S. Application Data

(62) Division of application No. 16/803,226, filed on Feb. 27, 2020, now Pat. No. 11,164,875.

(30) Foreign Application Priority Data

Mar. 6, 2019 (FR) ..................................... 1902278

(51) Int. Cl.
*H01L 29/66* (2006.01)
*H01L 27/108* (2006.01)
(Continued)

(52) U.S. Cl.
CPC .. *H01L 27/10864* (2013.01); *H01L 27/11521* (2013.01); *H01L 28/91* (2013.01); *H01L 29/66181* (2013.01); *H01L 29/945* (2013.01)

(58) Field of Classification Search
CPC ......... H01L 27/10829; H01L 27/10861; H01L 27/10864; H01L 27/11521; H01L 28/191; H01L 29/66181; H01L 27/945
(Continued)

(56) References Cited

U.S. PATENT DOCUMENTS

2005/0012159 A1* 1/2005 Sekimoto ............ H01L 27/0629
257/532
2014/0145299 A1    5/2014 Kalnitsky et al.
(Continued)

OTHER PUBLICATIONS

INPI Search Report and Written Opinion for FR 1902278 dated Dec. 11, 2019 (10 pages).
(Continued)

*Primary Examiner* — Hoai V Pham
(74) *Attorney, Agent, or Firm* — Crowe & Dunlevy

(57) ABSTRACT

A capacitive element is located in an active region of the substrate and on a front face of the substrate. The capacitive element includes a first electrode and a second electrode. The first electrode is formed by a first conductive region and the active region. The second electrode is formed by a second conductive region and a monolithic conductive region having one part covering a surface of said front face and at least one part extending into the active region perpendicularly to said front face. The first conductive region is located between and is insulated from the monolithic conductive region and a second conductive region.

15 Claims, 3 Drawing Sheets

(51) Int. Cl.
*H01L 27/11521* (2017.01)
*H01L 49/02* (2006.01)
*H01L 29/94* (2006.01)

(58) Field of Classification Search
USPC ........................................................ 257/301
See application file for complete search history.

(56) References Cited

U.S. PATENT DOCUMENTS

2019/0067291 A1  2/2019  Marzaki et al.
2021/0036097 A1  2/2021  Tsai et al.

OTHER PUBLICATIONS

Klootwijk, et al: "Ultrahigh Capacitance Density for Multiple ALD-Grown MIM Capacitor Stacks in 3-D Silicon," IEEE Electron Device Letters, New York, US, vol. 29, No. 7, Jul. 1, 2008, pp. 740-742.

* cited by examiner

CAPACITIVE ELEMENT COMPRISING A MONOLITHIC CONDUCTIVE REGION HAVING ONE PART COVERING A FRONT SURFACE OF A SUBSTRATE AND AT LEAST ONE PART EXTENDING INTO AN ACTIVE REGION PERPENDICULARLY TO THE FRONT SURFACE

CROSS REFERENCE TO RELATED APPLICATIONS

This application is a divisional of U.S. patent application Ser. No. 16/803,226, filed Feb. 27, 2020, which claims the priority benefit of French Application for Patent No. 1902278 filed on Mar. 6, 2019, the contents of which are hereby incorporated by reference in their entireties to the maximum extent allowable by law.

TECHNICAL FIELD

Embodiments and uses relate to integrated circuits, particularly the manufacture of integrated circuits comprising capacitive elements.

BACKGROUND

Capacitive elements are typically present in numerous integrated circuits and usually occupy a surface area which is not negligible and may be large in some applications.

The expression "occupied surface area" is typically taken to mean the surface area dedicated to the production of the element, also known as the "surface footprint", on a face of a semiconductor substrate from which the various semiconductor components are made, in the "FEOL" part of the integrated circuit ("FEOL" is the abbreviation for "Front End Of Line", typically used by those skilled in the art).

Some technologies allow the capacitive element to operate in accumulation mode and in inversion mode simultaneously, but typically comprise one or more isolation rings for electrically isolating the semiconductor casing, in which the capacitive element is formed, from the substrate. This type of isolation ring typically forms a peripheral structure enclosing the capacitive element, and the surface area occupied by such a peripheral structure is counted as part of the surface area occupied by the capacitive element.

It is desirable to reduce the size of the capacitive elements, in order to reduce the surface area occupied by capacitive element formations in the integrated circuits.

It is also desirable to limit the manufacturing steps dedicated solely to the forming of a given element, such as a capacitive element, in an integrated circuit.

SUMMARY

According to one aspect, an integrated circuit comprises a semiconductor substrate having an active region and a front face, and a capacitive element located in the active region and on part of the front face.

The capacitive element comprises a first electrode and a second electrode.

The first electrode comprises a first conductive region and the active region.

The second electrode comprises a second conductive region and a monolithic conductive region having one part covering a surface area of said front face and at least one part extending into the active region perpendicularly to said front face.

The first conductive region is located between the monolithic conductive region and the second conductive region.

The expression "monolithic region" is defined to mean, in the context of this application, that the region is formed from a single, uniform, solid block of the same material.

According to this aspect, the capacitive element has a structure that increases the surface area of the capacitive interfaces between the two electrodes that defines the capacitive effect, without thereby increasing the surface area occupied by the capacitive element on the substrate. The size of the capacitive element may thus be reduced.

According to one embodiment, the active region is doped with a first type of conductivity and comprises, on the front face, a counter-implant layer doped with a second type of conductivity opposite the first type of conductivity, the first electrode comprising, in the active region, a first contact area overdoped with the first type of conductivity and a second contact area overdoped with the second type of conductivity, electrically connected to the counter-implant layer.

The counter-implant layer, with a type of conductivity opposite the type of conductivity of the active region, notably provides for improved operation in inversion mode, and enables the conventional bulky peripheral isolation structure to be dispensed with.

According to one embodiment, the first conductive region, the second conductive region and the monolithic conductive region each comprise polycrystalline silicon.

According to one embodiment, the capacitive element comprises a dielectric region which electrically isolates the first electrode and the second electrode.

Advantageously, the dielectric region comprises a first dielectric layer which electrically isolates said monolithic conductive region and said active region, a second dielectric layer which electrically isolates said first conductive region and said monolithic conductive region, and a third dielectric layer which electrically isolates said second conductive region and the first conductive region.

For example, the first dielectric layer may have a thickness of between 3 nm and 4 nm, the second dielectric layer may have a thickness of between 7 nm and 8 nm, and the third dielectric layer may have a thickness of between 14 nm and 15 nm, or the first dielectric layer may have a thickness of between 8 nm and 9 nm, the second dielectric layer may have a thickness of between 8 nm and 9 nm, and the third dielectric layer may have a thickness of between 12 nm and 13 nm.

According to one embodiment, the integrated circuit further comprises a "nonvolatile memory device" incorporating at least one memory cell comprising a floating-gate transistor and/or a vertical-gate buried transistor.

Advantageously, said vertical-gate buried transistor comprises a vertical gate formed in the material of the monolithic conductive region, and said floating-gate transistor comprises floating gate formed in the material of the first conductive region and/or comprises a control gate formed in the material of the second conductive region.

For example, said vertical-gate buried transistor comprises a vertical gate oxide formed in the material of the first dielectric layer, said floating-gate transistor comprises a tunnel oxide formed in the material of the second dielectric layer, and/or said floating-gate transistor comprises a control gate dielectric region formed in the material of the third dielectric layer.

According to another aspect, a method for manufacturing a capacitive element comprising a first electrode and a second electrode comprises: forming an active region by delimitation of the active region in a semiconductor substrate having a front face; forming a monolithic conductive region by etching a trench extending into the active region perpendicularly to the front face and filling of said trench with a conductive material overflowing from the trench over part of the front face, so that the monolithic conductive region comprises one part covering a surface area of said front face and at least one part extending into the active region perpendicularly to said front face; forming a first conductive region; forming a second conductive region; electrically coupling to said first and second conductive regions so as to form the first electrode comprising the first conductive region and the active region and the second electrode comprising the monolithic conductive region and the second conductive region; the steps being arranged so that the first conductive region is located between the monolithic conductive region and the second conductive region.

The method according to this aspect has, notably, the advantage of comprising steps that may be provided for manufacturing other elements of an integrated circuit, such as nonvolatile memory cells.

According to one embodiment, forming the active region comprises doping of the active region with a first type of conductivity; implanting into the front face of counter-implant dopants with a second type of conductivity opposite the first type of conductivity; forming a first contact area by local overdoping with the first type of conductivity; and forming a second contact area by local overdoping with the second type of conductivity.

According to one embodiment, forming the first conductive region, forming the second conductive region and forming the monolithic conductive region each comprise depositing polycrystalline silicon.

According to one embodiment, the method further comprises forming dielectric regions which electrically isolate the first electrode and the second electrode.

Advantageously, forming the dielectric regions comprises: forming a first dielectric layer between said monolithic conductive region and said active region, forming a second dielectric layer between said first conductive region and the monolithic conductive region, and forming a third dielectric layer between said second conductive region and the first conductive region.

For example, forming the dielectric regions may be configured to form the first dielectric layer having a thickness of between 3 nm and 4 nm, the second dielectric layer having a thickness of between 7 nm and 8 nm, and the third dielectric layer having a thickness of between 14 nm and 15 nm, or to form the first dielectric layer having a thickness of between 8 nm and 9 nm, the second dielectric layer having a thickness of between 8 nm and 9 nm, and the third dielectric layer having a thickness of between 12 nm and 13 nm.

According to one embodiment, forming the first dielectric layer is carried out simultaneously with forming a vertical gate oxide layer of a vertical-gate transistor, and/or forming the second dielectric layer is carried out simultaneously with forming a tunnel dielectric of a floating-gate transistor, and/or forming the third dielectric layer is carried out simultaneously with forming a control gate oxide of a floating-gate transistor.

According to one embodiment, forming the monolithic conductive region is carried out simultaneously with forming a vertical gate of a vertical-gate buried transistor.

According to one embodiment, forming the first conductive region is carried out simultaneously with forming a floating gate of a floating-gate transistor, and/or forming the third dielectric layer is carried out simultaneously with forming a control gate oxide of the floating-gate transistor, and/or forming the second conductive layer is carried out simultaneously with forming a control gate oxide of the floating-gate transistor.

BRIEF DESCRIPTION OF THE DRAWINGS

Other advantages and characteristics of the invention will be apparent from a perusal of the detailed description of embodiments and uses, which are not limiting in any way, and the appended drawings, in which.

DETAILED DESCRIPTION

FIGS. 1-8 show results of steps of an example of a method for manufacturing a capacitive element, carried out successively in the order of the numbering of the figures. The figures show a section through a semiconductor substrate SUB, at a front face FA of the substrate SUB. The front face FA is the face located at the FEOL (for "Front End Of Line") of the integrated circuit in the course of manufacture.

FIGS. 1 to 7 show schematically two parts of the integrated circuit. One part, PCTR, is a part in which an advantageous capacitive element CTR is formed. Another part, PMEM, is a part which in future will include another device of the integrated circuit.

In the example of a method described in relation to said FIGS. 1 to 8, the manufacturing steps for forming the device in part PMEM are advantageously carried out in parallel for the manufacture of the capacitive element CTR. In this connection, the device of the integrated circuit in part PMEM may advantageously comprise vertical-gate buried transistors and floating-gate transistors, as for example in some known embodiments of memory cells of a nonvolatile memory.

Figure 1:
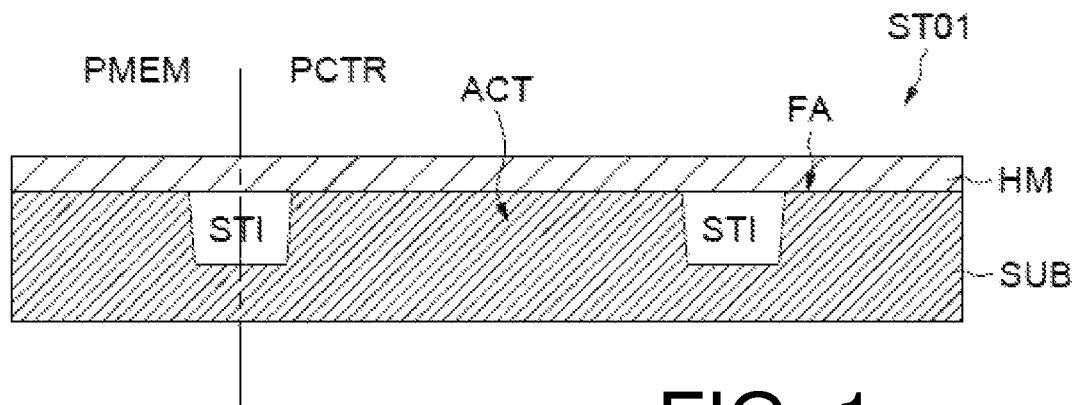
FIGS. 1-8 show steps of an example process for forming an integrated circuit including a capacitive element.

FIG. 1 shows the result of a step ST01 comprising, notably, delimitation of an active region ACT in the substrate SUB by lateral isolation regions STI. The lateral isolation regions STI are, for example, of the shallow trench isolation type.

The substrate is made of silicon and is doped with a first type of conductivity, for example p-type.

Additionally, a hardmask layer HM is formed on the surface of the substrate SUB and covers the front face FA of the substrate SUB. The hardmask layer HM may comprise silicon nitride.

Step ST01 may also comprise other formations, such as a definition of high voltage casing, notably in part PMEM.

Figure 2:
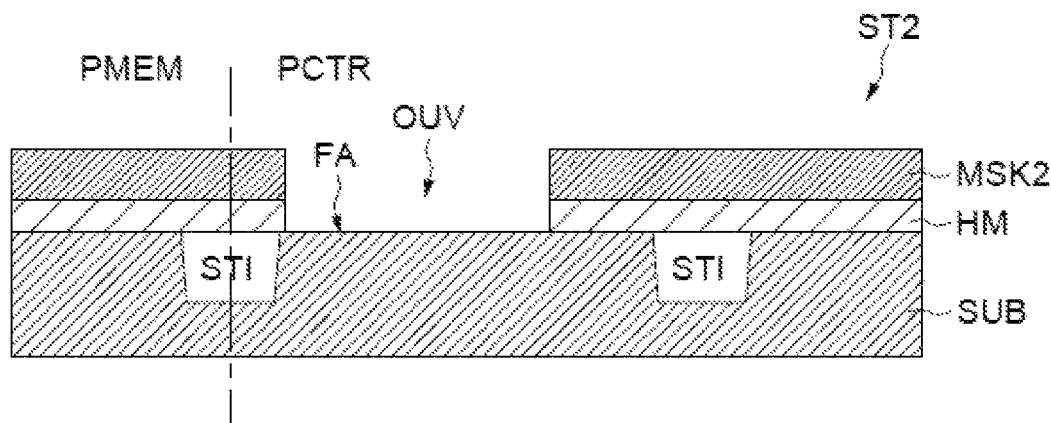

FIG. 2 shows the result of a step ST2 comprising the etching of a part of the hardmask HM located over the active region ACT, at the position where the capacitive element CTR will be formed. The etching comprises the formation of a photolithography mask MSK2 having an opening OUV defining the area of the etching of the hardmask layer HM. When etched, the hardmask HM includes the same opening OUV that has been transferred in this way, exposing the corresponding part of the active region ACT.

Figure 3:
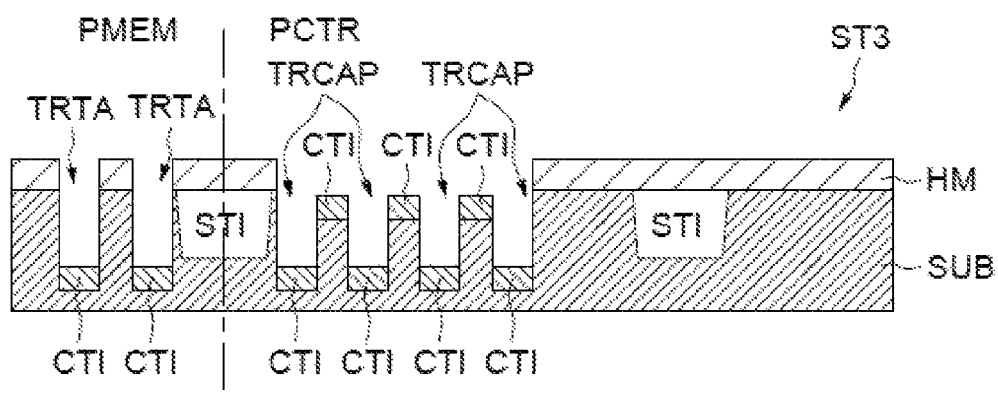

FIG. 3 shows the result of a step ST3 comprising the etching of one or more trenches TRCAP extending into the active region ACT perpendicularly to the front face FA.

The trenches TRCAP are etched from the front face FA of the substrate SUB, in the opening OUV (FIG. 2) of the hardmask HM.

The position of the trenches TRCAP may be defined by a step of photolithography using a mask (not shown).

Step ST3 also comprises a vertical anisotropic implantation of a counter-implant layer CTI into the parts not covered by the hardmask HM.

The vertical anisotropic implantation comprises a shallow implantation, notably at the front face FA, of dopants with a second type of conductivity opposite the first type of conductivity, for example n-type. The implantation of the counter-implant layer is also carried out at the bottom of the trenches TRCAP, but not on the sides of the trenches TRCAP.

Advantageously, step ST3 is carried out simultaneously with a step that is also provided in part PMEM of the integrated circuit. In the example shown, the trenches TRTA for receiving vertical-gate buried transistors are deeply etched into the substrate SUB, from the hardmask layer HM. Thus the counter-implant layer CTI is located only at the bottom of the trenches TRTA in part PMEM. The implantation of the counter-implant layer is provided, for example, for forming a source region of said vertical-gate buried transistors.

Figure 4:
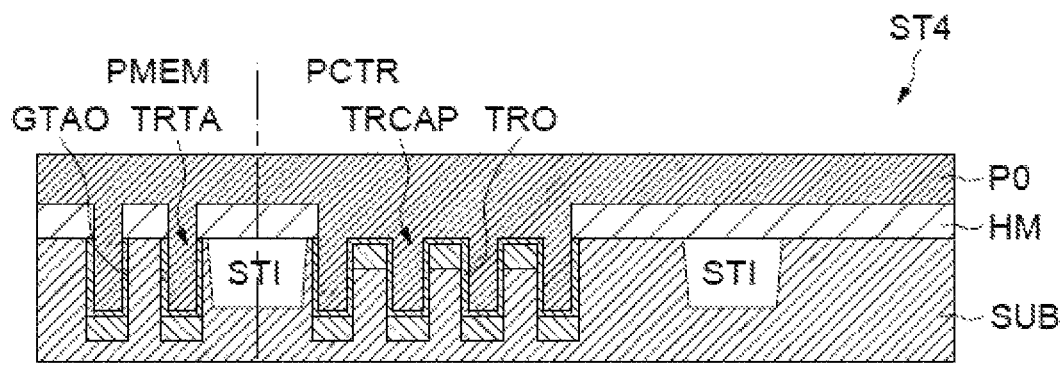

FIG. 4 shows a result of a step ST4 comprising formation of a first dielectric layer TRO on the sides and the bottom of the trenches TRCAP, as well as on the remaining part of the front face FA of the active region ACT exposed in the opening OUV (FIG. 2), notably that located between each trench TRCAP.

The formation of the first dielectric layer TRO is advantageously carried out simultaneously with the formation of a vertical gate oxide GTAO on the sides and the bottom of the trenches TRTA for receiving vertical-gate buried transistors in part PMEM of the integrated circuit.

The first dielectric layer TRO may have a thickness of between 3 nm and 4 nm, or between 8 nm and 9 nm, according to respective examples of a first and a second integrated circuit technology.

Additionally, step ST4 comprises the filling of the trenches TRCAP with a conductive material P0, overflowing the trenches over part of the front face FA, and over the hardmask HM.

This overflow may be obtained by excess filling of the trenches with the conductive material P0.

For example, the conductive material P0 may comprise polycrystalline silicon.

Advantageously, the filling of the trenches TRCAP with a conductive material P0 is carried out simultaneously with a filling provided in a step of forming the vertical gates of the buried transistors in part PMEM of the integrated circuit.

Figure 5:
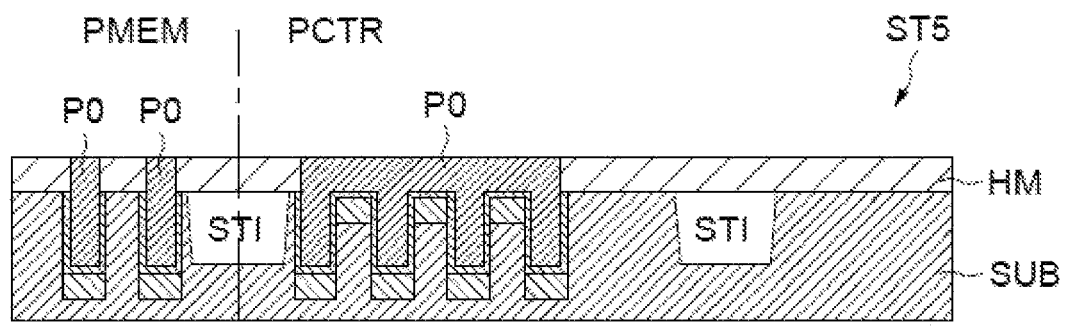

FIG. 5 shows the result of a step ST5 comprising a levelling of the conductive layer P0 deposited in excess in step ST4.

The levelling comprises a removal of the excessive deposit of conductive material P0 until the surface of the hardmask layer HM is reached, this layer acting as a stop layer in this case.

The levelling may be carried out by means of a "CMP" technique (for "Chemical Mechanical Polishing" according to the usual English term), or if necessary by an etching technique of the "PEB" type (for "Poly Etch Back" according to the usual English term), the parameters of which are set in time on the basis of the thickness of the surplus material.

Thus, a monolithic conductive region P0 is formed in the opening OUV (FIG. 2) of the hardmask HM, as well as in the trenches TRCAP.

The conductive region P0 is monolithic in that it is formed from a single, uniform, solid block of the same material (polycrystalline silicon P0).

Additionally, the first dielectric region TRO is thus located between said monolithic conductive region P0 and said active region ACT.

Figure 6:
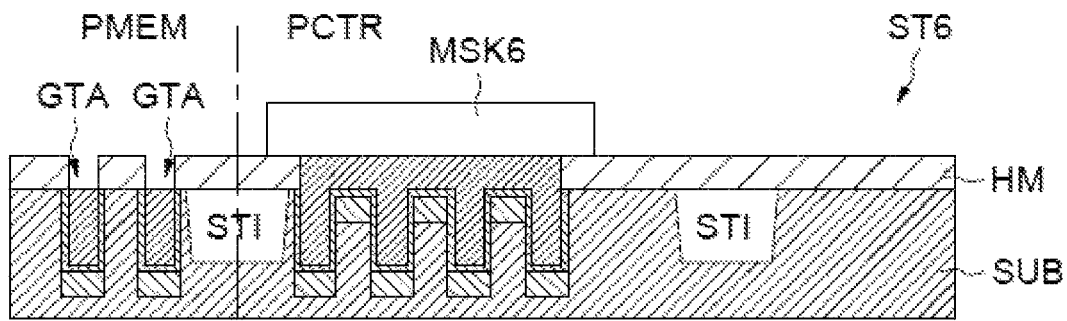

FIG. 6 shows the result of a step ST6 for finalizing the formation of the vertical gates of the buried transistors GTA in part PMEM. Step ST6 comprises the removal, by dry etching, of the part of the conductive material P0 remaining on the front face FA, through the thickness of the hardmask HM.

In this step ST6, the monolithic conductive region P0 of part PCTR is protected by a mask MSK6 which is impermeable to said dry etching.

Figure 7:
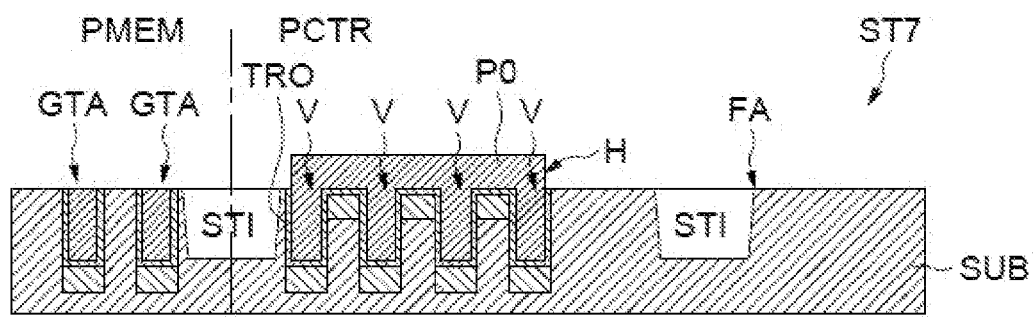

FIG. 7 shows the result of a step ST7 comprising the removal of the hardmask layer HM, after the removal of the mask MSK6 (FIG. 6).

The removal of the hardmask layer HM may comprise selective wet etching of the material forming the hardmask HM, which is typically silicon nitride.

The monolithic conductive region P0 has thus been formed with a horizontal part H covering a surface of said front face FA, and at least one vertical part V extending into the active region ACT perpendicularly to said front face FA.

Thus, a first capacitive interface is formed between the vertical part V of the monolithic conductive region P0 and the active region ACT of the substrate SUB, and a second capacitive interface is formed between the horizontal part H of the monolithic conductive region P0 and the active region ACT of the substrate SUB, said vertical part V and horizontal part H of the monolithic conductive region P0 being electrically separated from the active region ACT by the first dielectric layer TRO.

Because of this configuration of the monolithic conductive region P0 it is possible, notably, to maximize the surface area of the capacitive interface between the conductive region P0 and the active region ACT in the substrate SUB.

Figure 8:
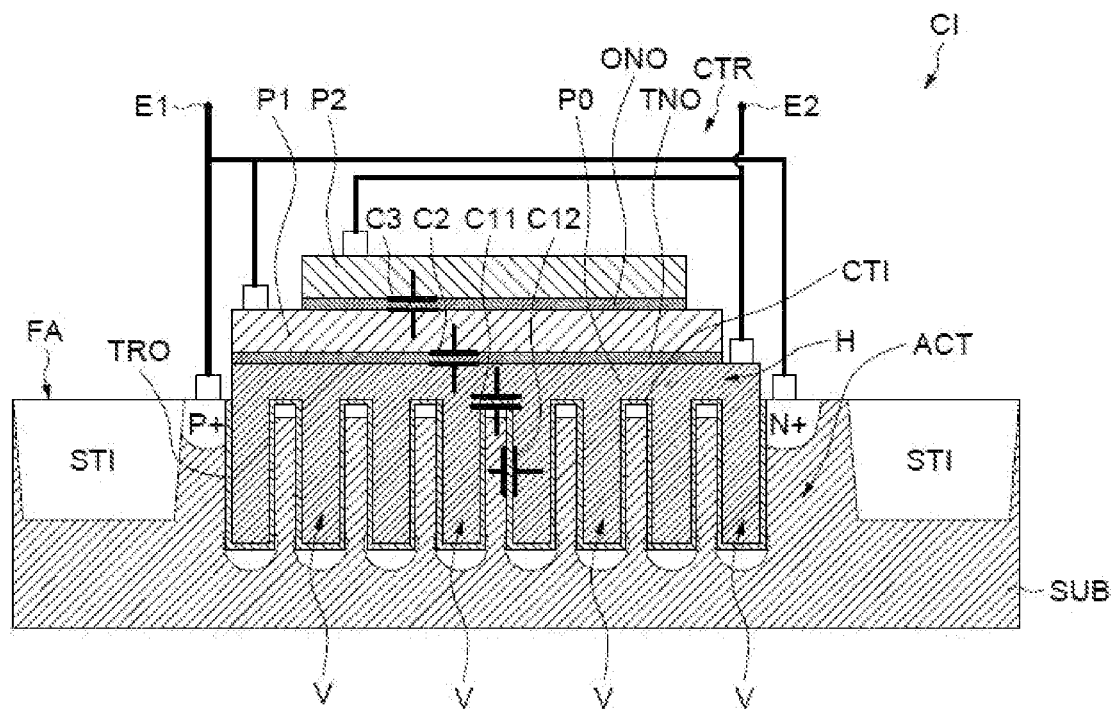

Additionally, with reference to FIG. 8, the method comprises the formation of a second dielectric layer TNO on the horizontal part H of the monolithic conductive region P0, the formation of a first conductive region P1 on the second dielectric layer TNO, the formation of a third dielectric layer ONO on the first conductive layer P1, and the formation of a second conductive layer P2 on the third dielectric layer ONO.

Advantageously, the second dielectric layer TNO may be formed simultaneously with the formation of a tunnel dielectric of a floating-gate transistor in part PMEM (not shown), the first conductive region P1 may be formed simultaneously with the formation of a floating gate of the floating-gate transistor, the third dielectric layer ONO may be formed simultaneously with the formation of a control gate oxide of the floating-gate transistor, and the second conductive layer P2 may be formed simultaneously with the formation of a control gate of the floating-gate transistor.

The first conductive region P1, and the floating gate of the floating-gate transistor, if present, may comprise polycrystalline silicon. Similarly, the second conductive region P2, and the control gate of the floating-gate transistor, if present, may comprise polycrystalline silicon.

The first dielectric layer TRO may have a thickness of between 7 nm and 8 nm according to the first integrated circuit technology mentioned above, or may have a thickness of between 8 nm and 9 nm according to said second technology.

The second dielectric layer ONO, comprising a stack of oxide, nitride and silicon oxide layers for example, may have a thickness of between 14 nm and 15 nm according to said first technology, or may have a thickness of between 12 nm and 13 nm according to said second technology.

The first conductive region P1 is thus located between the monolithic conductive region P0 and the second conductive region P2, and consequently forms two additional capacitive interfaces with each of said conductive regions (P0 and P2), electrically separated by the second dielectric region TNO and by the third dielectric region ONO respectively.

The method also comprises the formation of a first contact area P+, comprising local overdoping with the first type of conductivity, enabling an electrical coupling to be formed with the active region ACT.

The method also comprises the formation of a second contact area N+, comprising local overdoping with the second type of conductivity, enabling an electrical coupling to be formed with the counter-implant layer CTI.

In fact, although it is not visible in FIGS. 3 to 8, part of the counter-implant layer CTI, for example the part located beyond the end of the trenches TRCAP in the direction perpendicular to the plane of FIG. 8, connects the second contact area N+ electrically to each of the portions of the counter-implant layer CTI located between two trenches TRCAP.

Finally, the method comprises electrical coupling between some of said conductive regions formed previously, so as to form the first electrode E1 of the capacitive element CTR and a second electrode E2 of the capacitive element CTR.

The coupling is carried out in such a way that the first electrode E1 comprises the first conductive region P1 and the active region ACT, and the second electrode E2 comprises the monolithic conductive region P0 and the second conductive region P2.

An example of an advantageous method for manufacturing a capacitive element CTR has been described. This example of a method is, notably, virtually stand-alone (that is to say, it introduces no supplementary step dedicated to this method, or very few such steps) within the context of the parallel formation of a memory cell of a nonvolatile memory comprising a vertical-gate buried transistor and a floating-gate transistor.

FIG. 8 thus shows an example of the formation of an integrated circuit CI comprising the capacitive element CTR, manufactured according to the example of a method described above. Part PMEM of the integrated circuit CI, described previously in relation to FIGS. 1 to 7, is no longer shown, but could comprise, for example, a known nonvolatile memory device comprising memory cells provided with a vertical-gate buried transistor, and a state transistor comprising a floating gate and a control gate.

To summarize, the capacitive element CTR comprises a monolithic conductive region P0 having a horizontal part H covering a surface of said front face FA and at least one vertical part V extending into the active region ACT perpendicularly to said front face FA, together with a first conductive region P1 located between the monolithic conductive region P0 and a second conductive region P2.

Because of this structure of the capacitive element CTR, it is possible to maximize the cumulative extension of the capacitive interfaces between the two electrodes E1, E2, for a minimum surface footprint.

This is because the capacitive element CTR comprises first capacitive interfaces C11, C12 on either side of the first dielectric layer TRO, between the horizontal part H (covering a surface of said front face FA) of the monolithic conductive region P0 (the second electrode E2) and the active region ACT (the first electrode E1), and also between the vertical parts V (extending into the active region ACT perpendicularly to said front face FA) of the monolithic conductive region P0 (the second electrode E2) and the active region ACT (the first electrode E1).

The capacitive element CTR further comprises a second capacitive interface C2, on either side of the second dielectric layer TNO, between the first conductive region P1 (the first electrode E1) and the monolithic conductive region P0 (the second electrode E2), together with a third capacitive interface C3, on either side of the third dielectric layer ONO, between the second conductive region P2 (the second electrode E2) and the first conductive region P1 (the first electrode E1).

Additionally, the active region ACT is doped with a first type of conductivity and comprises a counter-implant layer CTI doped with a second type of conductivity opposite the first type of conductivity. The first electrode E1 is also electrically connected both to the active region ACT with the first type of conductivity and to the counter-implant layer CTI with the second type of conductivity.

The presence of the counter-implant layer CTI may provide a source of minority carriers in the active region ACT in inversion mode, and there is no need to bias the active region ACT of the substrate SUB to produce a stable capacitive effect in inversion mode. Thus the capacitive element CTR does not need a peripheral casing isolation structure, and this further reduces the surface area occupied by the formation of the capacitive element CTR.

Thus such a capacitive element CTR has a capacitive value per unit of raised surface area, and thus enables the surface area usage to be reduced for a formation having a given capacitive value.

The invention claimed is:

1. An integrated circuit, comprising:
a semiconductor substrate having an active region and a front face; and
a capacitive element located in the active region and on part of the front face, the capacitive element comprising:
a first electrode; and
a second electrode;
wherein the first electrode comprises a first conductive region and the semiconductor substrate in said active region;
wherein the second electrode comprises a second conductive region and a monolithic conductive region;
wherein the monolithic conductive region comprises a first part covering a surface of said front face and at least one second part extending perpendicularly to said front face into the semiconductor substrate in said active region; and
wherein the first conductive region is located between and insulated from both the monolithic conductive region and the second conductive region.

2. The integrated circuit according to claim 1, wherein semiconductor substrate in said active region is doped with a first type of conductivity, and further comprising, at the front face, a counter-implant layer in the semiconductor substrate that is doped with a second type of conductivity opposite the first type of conductivity, wherein the first electrode comprises, in the active region, a first contact area overdoped with the first type of conductivity and a second contact area overdoped with the second type of conductivity electrically that is connected to the counter-implant layer.

3. The integrated circuit according to claim 1, wherein the first conductive region, the second conductive region and the monolithic conductive region each comprise polycrystalline silicon.

4. The integrated circuit according to claim 1, wherein the capacitive element comprises a dielectric region which electrically isolates the first electrode and the second electrode.

5. The integrated circuit according to claim 4, wherein the dielectric region comprises a first dielectric layer which electrically isolates said monolithic conductive region and semiconductor substrate in said active region, a second dielectric layer which electrically isolates said first conductive region and said monolithic conductive region, and a third dielectric layer which electrically isolates said second conductive region and the first conductive region.

6. The integrated circuit according to claim 5, wherein the first dielectric layer has a thickness of between 3 nm and 4 nm, the second dielectric layer has a thickness of between 7 nm and 8 nm, and the third dielectric layer has a thickness of between 14 nm and 15 nm.

7. The integrated circuit according to claim 5, wherein the first dielectric layer has a thickness of between 8 nm and 9 nm, the second dielectric layer has a thickness of between 8 nm and 9 nm, and the third dielectric layer has a thickness of between 12 nm and 13 nm.

8. The integrated circuit according to claim 1, further comprising a nonvolatile memory device incorporating at least one memory cell comprising a floating-gate transistor, wherein said floating-gate transistor comprises a floating gate formed from a material layer from which the first conductive region is formed and a control gate formed from a material layer from which the second conductive region is formed.

9. The integrated circuit according to claim 8:
wherein the dielectric region comprises a first dielectric layer which electrically isolates said monolithic conductive region and said active region, a second dielectric layer which electrically isolates said first conductive region and said monolithic conductive region, and a third dielectric layer which electrically isolates said second conductive region and the first conductive region; and
wherein said floating-gate transistor comprises a tunnel oxide formed by a material layer which also forms the second dielectric layer, and a control gate dielectric region formed by a material layer which also forms the third dielectric layer.

10. The integrated circuit according to claim 1, further comprising a nonvolatile memory device incorporating at least one memory cell comprising a vertical-gate buried transistor, wherein said vertical-gate buried transistor comprises a vertical gate formed from a material layer from which the monolithic conductive region is formed.

11. The integrated circuit according to claim 10:
wherein the dielectric region comprises a first dielectric layer which electrically isolates said monolithic conductive region and said active region, a second dielectric layer which electrically isolates said first conductive region and said monolithic conductive region, and a third dielectric layer which electrically isolates said second conductive region and the first conductive region; and
wherein said vertical-gate buried transistor comprises a vertical gate oxide formed by a material layer which forms the first dielectric layer.

12. The integrated circuit according to claim 1, further comprising a trench extending perpendicularly to said front face into the semiconductor substrate in said active region, and wherein said at least one second part of said monolithic conductive region is located within said trench.

13. The integrated circuit according to claim 12, wherein the semiconductor substrate in said active region is doped with a first type of conductivity, and further comprising a counter-implant including a first implant portion in the semiconductor substrate at the front face and a second implant portion in the semiconductor substrate at a bottom of said trench, wherein said counter-implant is doped with a second type of conductivity opposite to the first type of conductivity.

14. The integrated circuit according to claim 12, wherein neither the first conductive region nor the second conductive region is located within said trench.

15. The integrated circuit according to claim 12, wherein said first part of said monolithic conductive region is formed by an overflow of material onto said front face which fills said trench and forms said at least one second part.

* * * * *